(12) United States Patent
Hongoh

(10) Patent No.: US 6,343,565 B1
(45) Date of Patent: Feb. 5, 2002

(54) FLAT ANTENNA HAVING ROUNDED SLOT OPENINGS AND PLASMA PROCESSING APPARATUS USING THE FLAT ANTENNA

(75) Inventor: Toshiaki Hongoh, Nakakoma-Gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/518,723

(22) Filed: Mar. 3, 2000

(30) Foreign Application Priority Data

Mar. 4, 1999 (JP) .......................... 11-057746

(51) Int. Cl.[7] ..................... C23C 16/00; H05H 1/00
(52) U.S. Cl. ................. 118/723 MW; 118/723 AN; 156/345; 315/111.21
(58) Field of Search ............... 118/723 MN, 723 ME, 118/723 MR, 723 AN; 315/111.21, 111.01, 111.41; 156/345

(56) References Cited

U.S. PATENT DOCUMENTS 4,985,109 A * 1/1991 Otsubo et al. ............ 156/345
5,134,965 A * 8/1992 Tokuda et al. ...... 118/723 MW
5,433,789 A * 7/1995 Kekehi et al. ...... 118/723 MW
5,698,036 A 12/1997 Ishii et al. .......... 118/723 MW
5,762,814 A * 6/1998 Ohara et al. ................... 216/70

FOREIGN PATENT DOCUMENTS

| JP | 5-343334 | 12/1993 |
| JP | 8-111297 | 4/1996 |
| JP | 9-181052 | 7/1997 |
| JP | 2928577 | 5/1999 |

* cited by examiner

*Primary Examiner*—Gregory Mills
*Assistant Examiner*—P. Hassanzadeh
(74) *Attorney, Agent, or Firm*—Pillsbury Winthrop LLP

(57) ABSTRACT

A flat antenna is used for introducing a microwave into a process chamber so as to generate plasma within the process chamber. The flat antenna has a front surface to which the microwave is supplied and a back surface opposite to the front surface. The microwave is supplied to a center portion of the front surface and propagates in radial directions within the flat antenna. A plurality of openings are provided in the flat antenna so that each of the openings extends between the front surface and the back surface of the flat antenna. The contour of each of the openings is curved so as to prevent generation of an abnormal electrical discharge.

14 Claims, 8 Drawing Sheets

FIG.8
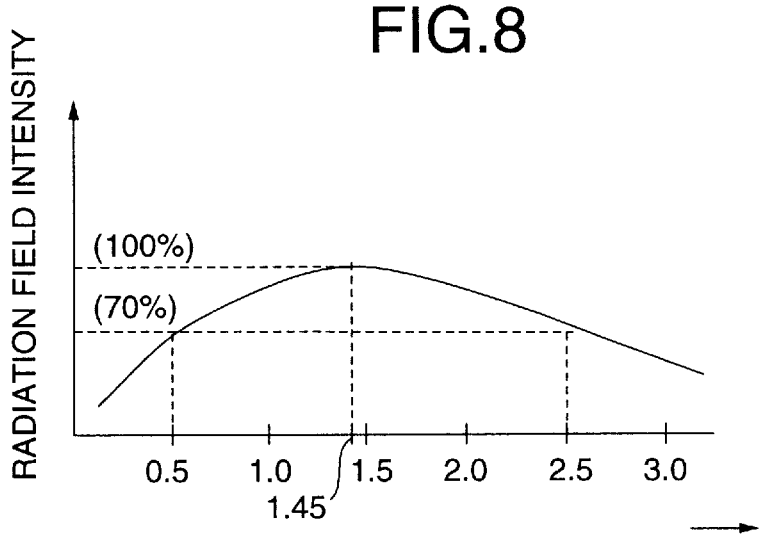
RATIO OF LENGTH OF CONTOUR OF OPENING TO WAVELENGTH OF MICROWAVE SUPPLIED TO FLAT ANTENNA
FIG.9A   FIG.9B   FIG.9C
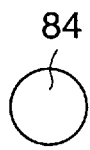  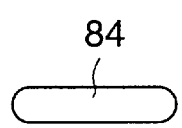
FIG.9D   FIG.9E   FIG.9F
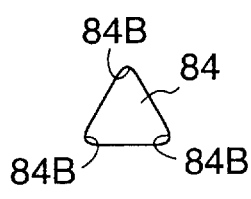 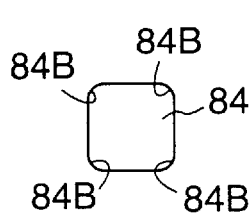 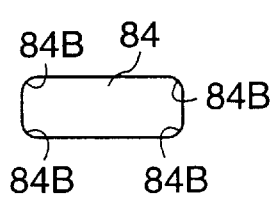
FIG.10
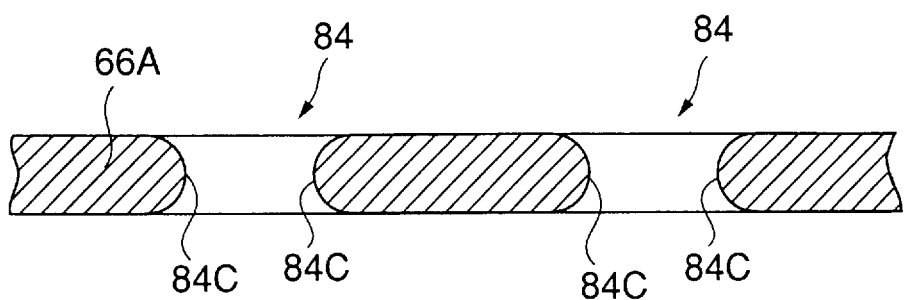

$LA-LB = \lambda/4$

FLAT ANTENNA HAVING ROUNDED SLOT OPENINGS AND PLASMA PROCESSING APPARATUS USING THE FLAT ANTENNA

BACKGROUND OF THE INVENTION

1. Field of the Invention

The present invention generally relates to plasma processing apparatuses and, more particularly, to a plasma processing apparatus which processes a wafer for producing a semiconductor device by using a plasma generated by a microwave.

2. Description of the Related Art

Recently, in a semiconductor device manufacturing process, plasma processing apparatuses have been used to perform semiconductor producing processes such as a deposition process, an etching process or an ashing or stripping process since high-density integration and fine structure are required for semiconductor devices. Particularly, a microwave plasma processing apparatus has become popular since the microwave plasma processing apparatus is capable of generating stable plasma at a relatively low vacuum of 0.1 millitorr (mTorr) to several tens of mTorr. The microwave plasma processing apparatus generates high-density plasma by using a microwave or a combination of a microwave and a magnetic field generated by a ring-like coil. The above-mentioned plasma processing apparatus is disclosed in Japanese Laid-Open Patents No. 5-343334 and No. 9-181052.

A description will now be given, with reference to FIGS. 1 and 2, of a conventional microwave plasma processing apparatus. FIG. 1 is a schematic cross-sectional view of a conventional microwave plasma processing apparatus. FIG. 2 is a plan view of an antenna member provided in the microwave plasma processing apparatus.

In FIG. 1, the conventional microwave plasma processing apparatus 2 comprises: a process chamber 4; a table 6 provided inside the process chamber 4; an insulating plate 8 defining a top plate of the process chamber 4 and positioned above the table 6; and an antenna member 10 positioned above the insulating plate 8. The process chamber 4 is constructed so that air inside the process chamber 4 can be evacuated to generate a vacuum therein. The insulating plate 8 is formed of a material that can transmit a microwave.

The antenna member 10 has a flat, disk-like shape as shown in FIG. 2, and has a thickness of several millimeters. Above the antenna member 10 is a slow-wave member 16 formed of a dielectric material so as to reduce the wavelength of a microwave in radial directions of the antenna member 10. The antenna member 10 is provided with many slots 14 each of which has an elongated rectangular shape when viewed from a direction perpendicular to the flat surface of the antenna member 10. Generally, the slots 14 are arranged along concentric circles as shown in FIG. 2, or arranged along a spiral.

The plasma processing apparatus 2 has a coaxial waveguide 12 connected to a center portion of the antenna member 10 so as to introduce a microwave generated by a microwave generator (not shown in the figure) into the antenna member 10. The microwave introduced into the center portion of the antenna member 10 propagates through the antenna member 10 in radial directions thereof, and is directed downwardly toward the interior of the process chamber 4. The microwave introduced into the process chamber 4 generates plasma so that a wafer W placed on the table 6 in the process chamber 4 is subjected to predetermined plasma processing such as plasma etching or deposition.

FIG. 3 is an enlarged plan view of the slot 14 formed in the antenna member 10. FIG. 4 is a cross-sectional view of a part of the antenna member 10 taken along a line IV—IV of FIG. 2.

As shown in FIG. 3, each of the slots 14 has a rectangular shape having a width L1 of between 10 and 20 millimeters and a length L2 of about several tens of millimeters. The inner walls 14A of the slot 14 are perpendicular to the flat surface of the antenna member 10.

It is known that a microwave causes concentration of an electric field near a sharp corner when the microwave propagates in a solid medium. Thus, when the microwave propagates within the antenna member 10 in radial directions from the center portion thereof, a concentration of the electric field occurs at each corner 14B of the slot 14 and each edge between the inner wall 14A and a flat surface of the antenna member 10. When such a concentration of an electric field occurs, the plasma density is locally increased, and, thereby, an abnormal discharge occurs at the position where the electric field density is increased. This results in unevenness of the plasma density over the entire surface of the wafer.

Additionally, in a case in which a rectangular opening is positioned perpendicular to a radial direction of the antenna member 10, an abnormal discharge frequently occurs between the opposite longer sides of the rectangular opening at a middle position between the shorter sides when the power of the microwave is large.

In order to avoid such a problem, the plasma processing must be performed with an input power level at which the above-mentioned problem does not occur. In this case, there is a problem in that the throughput of the semiconductor manufacturing process is greatly decreased since the ability to increase the plasma density is limited.

Additionally, the above-mentioned Japanese Laid-Open Patent Application No. 5-343334 discloses a slot formed by two copper-plate antennas stacked on each other so that the area of opening of the slot can be changed by rotating the copper-plate antennas relative to each other. In such a case, since a single slot is formed by the two copper-plate antennas in the stacked state, a step is formed in the stacked portion of the slot. Thus, there may be a problem in that an abnormal discharge is generated due to the concentration of electric field at the stacked portion.

SUMMARY OF THE INVENTION

It is a general object of the present invention to provide an improved and useful flat antenna of a plasma processing apparatus in which the above-mentioned problems are eliminated.

A more specific object of the present invention is to provide a flat antenna of a plasma processing apparatus to which a high power level can be supplied without generation of an abnormal discharge.

In order to achieve the above-mentioned objects, there is provided according to one aspect of the present invention a flat antenna adapted to be used for introducing a microwave into a process chamber so as to generate a plasma within the process chamber, the flat antenna comprising: a front surface to which the microwave is supplied and a back surface opposite to the front surface, the microwave being supplied to a center portion of the front surface and propagating in radial directions within the flat antenna; and a plurality of openings extending between the front surface and the back surface of the flat antenna, a contour of each of the openings being curved so as to prevent generation of an abnormal discharge.

According to the present invention, there is no sharp angle corner formed by each of the openings. Thereby, an electric field generated by the microwave transmitting through the flat antenna is not concentrated due to a sharp angle corner. Thus, the possibility of generation of an abnormal discharge at or in the vicinity of openings is reduced.

In one embodiment of the present invention, each of the openings may have an elongated elliptic shape. Alternatively, each of the openings may have a polygonal shape with rounded corners.

Additionally, the openings may be arranged along a plurality of concentric circles or a spiral so that the openings are evenly distributed over the entire flat antenna.

Additionally, there is provided according to another aspect of the present invention a flat antenna adapted to be used for introducing a microwave into a process chamber so as to generate a plasma within the process chamber, the flat antenna comprising: a front surface to which the microwave is supplied and a back surface opposite to the front surface, the microwave being supplied to a center portion of the front surface and propagating in radial directions within the flat antenna; and a plurality of pairs of openings having an elongated elliptic shape, each of the openings extending between the front surface and the back surface of the flat antenna, each pair consisting of a first opening and a second opening positioned perpendicular to the first opening so that each two adjacent openings form a T-like shape.

According to this invention, a circularly polarized microwave is generated and radiated from the flat antenna. That is, a current flowing from the center of the flat antenna first reaches the first opening, and then reaches the second opening in the same pair. Thus, the circularly polarized microwave is radiated from the pair of the first and second openings. Since the circularly polarized microwave does not generate a concentrated electric field near an edge of a wafer placed inside a process chamber of the plasma processing apparatus, a uniform plasma can be applied over the entire wafer.

The flat antenna according to the present invention is applied to a plasma processing apparatus so that uniform plasma is generated in the plasma processing apparatus.

Other objects, features and advantages of the present invention will become more apparent from the detailed description when read in conjunction with the accompanying drawings.

BRIEF DESCRIPTION OF THE DRAWINGS

FIG. 8 is a graph showing a relationship between the intensity of radiation of an electric field and the ratio of the length of the contour of the opening to the wavelength of the microwave supplied to the flat antenna;

FIGS. 9A through 9F are illustrations of various shapes of the openings provided in the flat antenna according to the first embodiment of the present invention;

FIG. 10 is an enlarged cross-sectional view of a part of the flat antenna for showing a rounded inner surface of the opening;

DETAILED DESCRIPTION OF THE PREFERRED EMBODIMENTS

Figure 1:
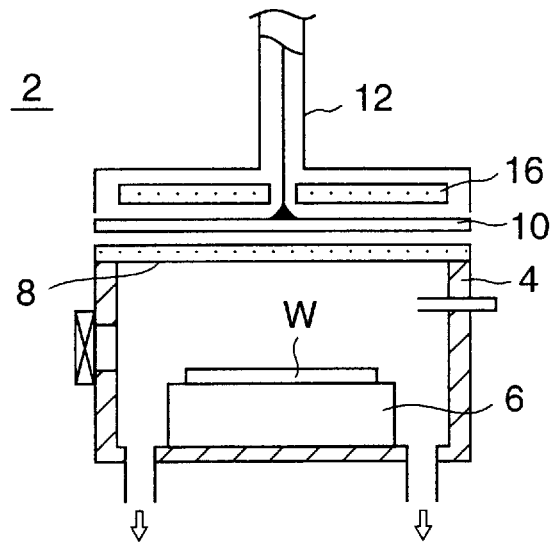
FIG. 1 is a schematic cross-sectional view of a conventional microwave plasma processing apparatus.
Figure 2:
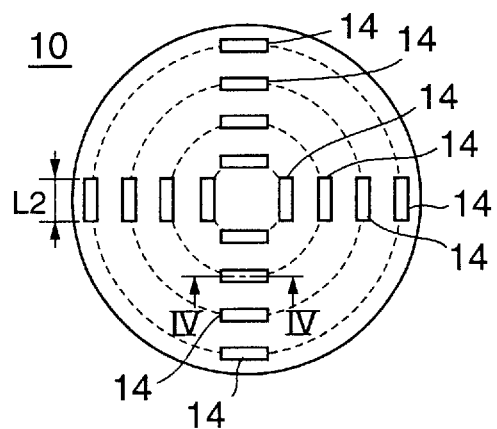
FIG. 2 is a plan view of an antenna member provided in the microwave plasma processing apparatus shown in FIG. 1.
Figure 3:
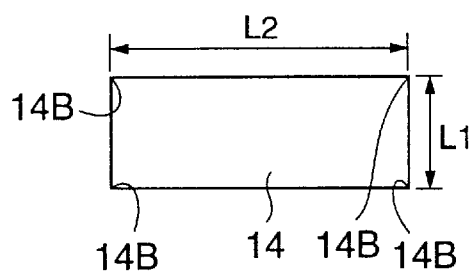
FIG. 3 is an plan view of a slot formed in the antenna member shown in FIG. 2.
Figure 4:
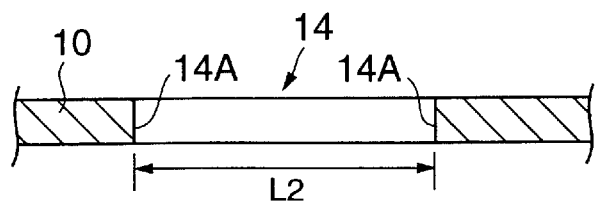
FIG. 4 is a cross-sectional view of a part of the antenna member taken along a line IV—IV of FIG. 2.
Figure 5:
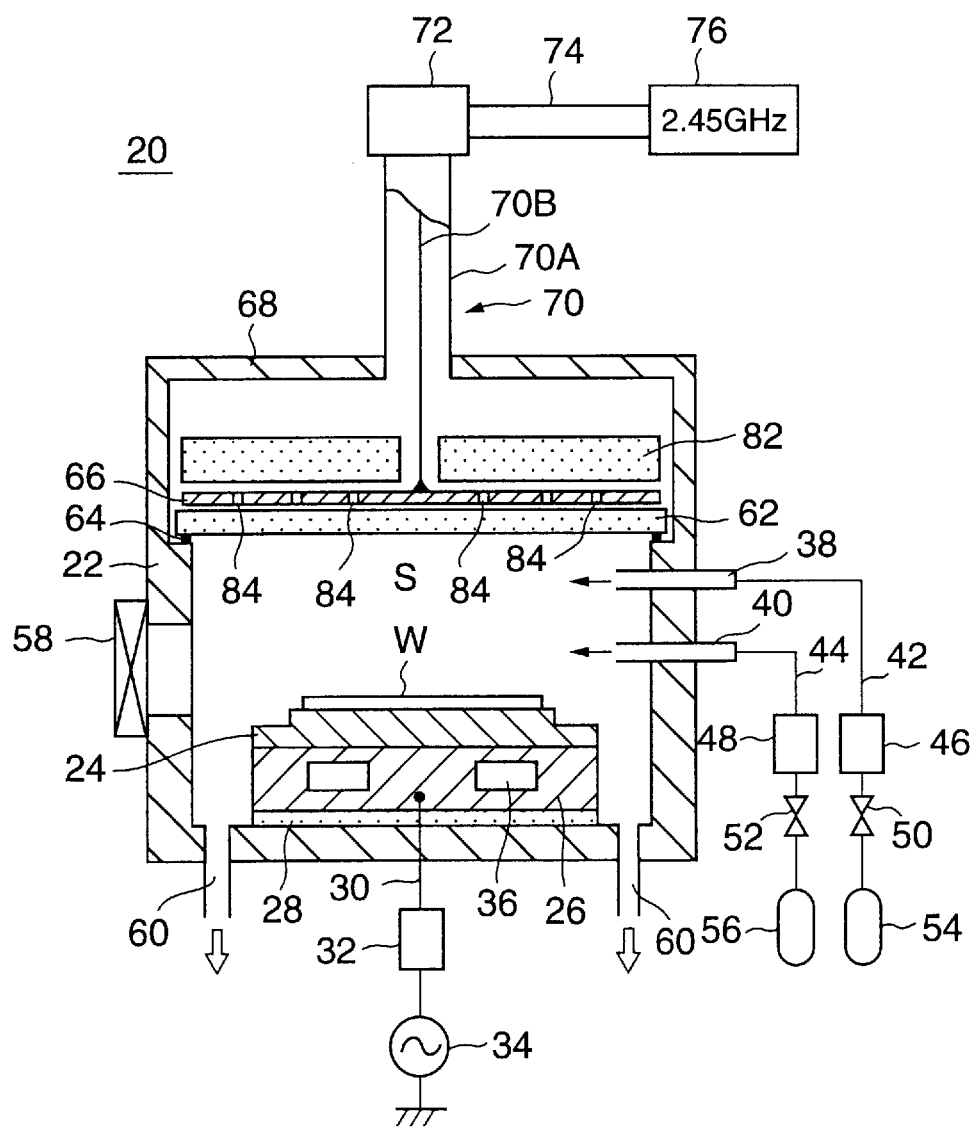
FIG. 5 is a cross-sectional view of a plasma processing apparatus having a flat antenna according to a first embodiment of the present invention.

A description will now be given, with reference to FIG. 5, of a first embodiment of the present invention. FIG. 5 is a cross-sectional view of a plasma processing apparatus having a flat antenna according to the first embodiment of the present invention.

The plasma processing apparatus 20 shown in FIG. 5 performs a plasma chemical vapor deposition (plasma CVD) process. The plasma processing apparatus 20 comprises a process chamber 22 having a cylindrical shape so as to form a sealed space S. A side wall and a bottom wall of the process chamber 22 are made of a conductive material such as aluminum.

A table 24 is situated within the process chamber 22 so that material to be processed such as a wafer W is placed thereon. The table 24 is made of an anodized aluminum alloy, and has a generally cylindrical shape having a raised, flat top surface. The table 24 is supported by a support table 26 which is made of an aluminum alloy and has a cylindrical shape. The support table 26 is fixed to a bottom of the process chamber 22 via an insulating member 28.

An electrostatic chuck or a clamping mechanism (not shown in the figure) is provided to the table 24 so as to retain the wafer W on the top surface of the table 24. The table 24 is electrically connected to a high-frequency power supply 34 of 13.56 MHz by a power supply line 30 via a matching box 32 so as to supply a bias voltage to the table 24. The high-frequency power supply 34 is not necessarily connected to the table 24 if the bias voltage is not needed.

The support table 26 supporting the table 24 is provided with a cooling jacket 36 through which cooling water flows so as to cool the wafer W during the plasma processing. It should be noted that a heater for heating the wafer 24 may be provided in the table 24 if it is necessary.

Nozzles 38 and 40 are provided on the side wall of the process chamber 22 so as to introduce various gasses into the process chamber 22. The nozzle 38 is a tubular member made from quartz so as to supply to the process chamber 22 a gas for generating plasma such as argon gas. The nozzle 38 is connected to a plasma gas supply source 54 by a supply line 42 via a mass flow controller 46 and a stop valve 50. The nozzle 40 is a tubular member made from quartz so as to supply a process gas such as a deposition gas to the process chamber 22. The nozzle 40 is connected to a process gas supply source 56 by a supply line 44 via a mass flow controller 48 and a stop valve 52. As for the process gas, $SiH_4$, $O_2$ or $N_2$ gas may be used.

A gate valve 58 is provided on the side wall of the process chamber 22. The gate valve 58 is opened when the wafer W is put inside the process chamber 22 and removed from the process chamber 22. Vacuum ports 60 are provided on the bottom of the process chamber 22. The vacuum ports 60 are connected to a vacuum pump (not shown in the figure) so as to evacuate air from the process chamber 22.

The top of the process chamber 22 is hermetically closed by an insulating plate 62 having a thickness of about 20 mm. A sealing member 64 such as an O-ring is provided between the insulating plate 62 and a top surface of the side wall of the process chamber 22. The insulating plate 62 is made of an insulating material such as $Sio_2$ or ceramics such as aluminum nitride (AlN) which has a high transmissivity with respect to a microwave.

A flat antenna 66 is provided on the top surface of the insulating plate 62. The flat antenna 66 serves as a bottom of a waveguide box 68 which has a cylindrical shape and integrally formed with the process chamber 22. The flat antenna 66 faces the top surface of the table 24 with the insulating plate 62 therebetween.

Outer tubing 70A of a coaxial waveguide 70 is connected to the center of the top portion of the waveguide box 68. An inner cable 70B is connected to the center portion of the flat antenna 66. The waveguide 70 is connected to a microwave generator 76, which generates a 2.45 GHz microwave, via a mode converter 72 so that the microwave generated by the microwave generator 76 is transmitted to the flat antenna 66. The frequency of the microwave is not limited to 2.45 GHz, and, for example, a microwave of 8.35 GHz may be used. As for the waveguide 70, a waveguide having a circular cross section or a square cross section or a coaxial waveguide may be used. In the present embodiment, the waveguide 70 is a coaxial waveguide. Additionally, a slow-wave member 82 having a predetermined thickness is provided on the top surface of the flat antenna 66 within the waveguide box 68. The slow-wave member 82 is provided, if necessary, so as to shorten the wavelength of the microwave according to its wavelength shortening effect.

Figure 6:
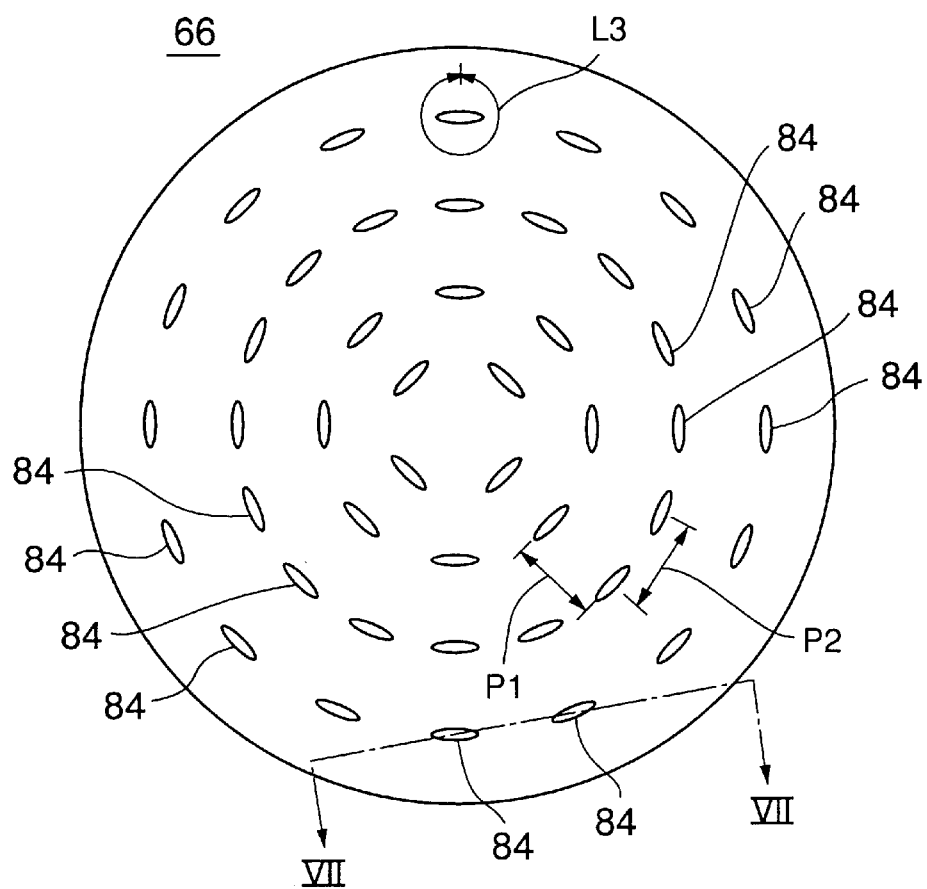
FIG. 6 is a plan view of the flat antenna shown in FIG. 5.
Figure 7:
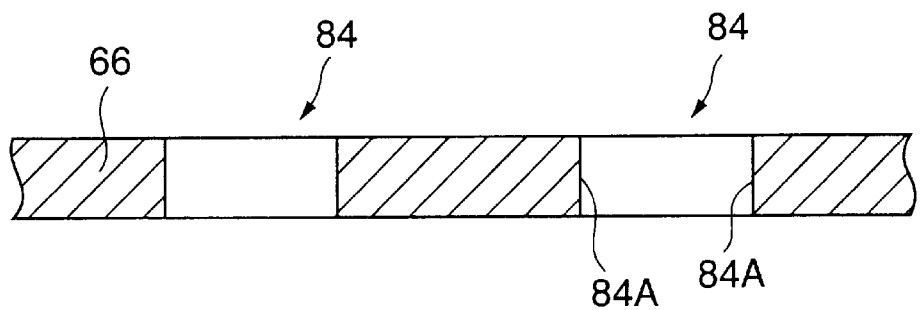
FIG. 7 is an enlarged cross-sectional view of a part of the flat antenna taken along a line VII—VII of FIG. 6.

A detailed description will now be given, with reference to FIGS. 6 and 7, of the flat antenna 66. FIG. 6 is a plan view of the flat antenna 66. FIG. 7 is a cross-sectional view of the flat antenna 66 taken along a line VII—VII of FIG. 6.

The flat antenna 66 can be a disk-like member having a diameter of 30 cm to 40 cm and a thickness of 1 mm to several millimeters so as to be applicable to an 8-inch wafer. The flat antenna 66 is made of a conductive material such as a silver plated copper plate or an aluminum plate. As shown in FIG. 6, the flat antenna 66 has a plurality of openings 84 each of which extends between the front and back surfaces of the flat antenna 66. The openings 84 are uniformly distributed over the entire flat antenna 66. The form of arrangement of the openings 84 is not limited to the specific arrangement, and can be a concentric arrangement, a spiral arrangement or a radial arrangement.

Additionally, the arrangement of the openings 84 is not limited to the uniform distribution as shown in FIG. 6, and the density of the openings 84 may be increased toward the periphery of the flat antenna 66.

The pitch P1 of the openings 84 in a radial direction and the pitch P2 of the openings 84 in a circumferential direction are not limited to specific lengths. However, in order to generate a uniform plasma, it is preferable that the pitches P1 and P2 be about 0.5 times to 2.5 times the wavelength A of the microwave supplied to the flat antenna 66. When the slow-wave member 82 is not provided on the flat antenna 66, the wavelength of the microwave supplied to the flat antenna 66 is substantially equal to the wavelength of the microwave in the vacuum. When the slow-wave member 82 is provided, the wavelength of the microwave supplied to the flat antenna 66 is substantially equal to the wavelength of the microwave transmitted in the slow-wave member 82.

In this embodiment, the openings 84 are formed by means of stamping. Accordingly, the inner surface 84A of each of the openings 84 is substantially perpendicular to the surface of the flat antenna 66, and the width of the inner surface 84A is equal to the thickness of the flat antenna 66.

A length L3 of the contour (circumference) of each of the openings 84 is preferably equal to 0.5 times to 2.5 times the wavelength of the microwave supplied to the flat antenna 66, and most preferably be 1.45 times the wavelength of the microwave supplied to the flat antenna 66 as explained later. Specifically, 2.45 GHz microwave (wavelength of about 122 mm) is generated by the microwave generator 76. When the slow-wave member 82 is used and the permittivity of the slow-wave member 82 is equal to 9, the wavelength $\lambda 1$ of the microwave supplied to the flat antenna 66 is about 41 mm ($\approx 122/3$) since the wavelength $\lambda 1$ is equal to $\lambda 0/\in^{1/2}$ ($\lambda 1 = \lambda 0/\in^{1/2}$), where $\lambda 0$ is the wavelength of the microwave in the vacuum and $\in$ is a permittivity of the material forming the slow-wave member. Accordingly, the length L3 of the contour of each of the openings 84 is in the range of 21 mm to 82 mm. If each of the openings 84 has a circular shape, the diameter of each of the circular openings 84 is in the range of 19 mm to 78 mm. When the slow-wave member 82 is not used, the diameter of each of the circular openings 84 is in the range of 19 mm to 78 mm.

A description will now be given of a plasma processing operation performed by the plasma processing apparatus 20 shown in FIG. 5.

First, the wafer W to be processed is put in the process chamber 22 through the gate valve 58 by using a convey arm (not shown in the figure). The wafer W is placed on the top surface of the table 24 by moving a lifter pin (not shown in the figure) up and down.

Thereafter, air inside the process chamber 22 is evacuated so that a negative pressure ranging from 0.1 mTorr to several tens of mTorr is generated inside the process chamber 22. Argon gas and a process gas such as $SiH_4$, $O_2$ or $N_2$ gas are introduced into the process chamber 22 via the nozzles 38 and 40, respectively, while the negative pressure is maintained inside the process chamber 22. At the same time, the microwave generated by the microwave generator 76 is introduced into the flat antenna 66 via the waveguide 74 and the coaxial waveguide 70 so as to supply to the space S the microwave of which wavelength is shortened by the slow-wave member 82. Thereby, the plasma is generated in the space S so that a predetermined plasma process such as a deposition of a film by a plasma CVD process is performed.

The 2.45 GHz microwave generated by the microwave generator 76 is subjected to a mode change. Then, the microwave propagates through the coaxial waveguide 70 in the TEM mode, and reaches the flat antenna 66 in the waveguide box 68. The microwave is supplied to the center portion of the flat antenna 66, and radially propagates through the flat antenna 66. While the microwave radially propagates through the flat antenna 66, the microwave is directed downward toward the space S by the openings 84 uniformly distributed in the flat antenna 66. Thereby, the microwave is introduced into the space S by passing through the insulating plate 62.

The thus-introduced microwave excites the argon gas in the process chamber 22, and, thereby, the argon gas plasma is generated. The plasma diffuses downward, and activates the process gas, which produce active species of the process gas. The active species act on the wafer W so that the plasma CVD process is performed.

As mentioned above, when the microwave radially propagates through the flat antenna 66 from the center portion to the periphery of the flat antenna 66, the microwave is directed downward by each of the openings 84. Since each of the openings 84 has an elliptic shape, that is, the contour of each of the openings 84 in a plan view consists of a curved line, there are no corner that could cause a concentration of an electric field. Accordingly, the microwave can be uniformly projected downwardly by each of the openings 84, which results in generation of plasma having a uniform density in the space S. Thus, evenness of the plasma process applied to the entire wafer W is improved.

Additionally, since the concentration of an electric field which increases the possibility of generation of an abnormal discharge can be prevented, the microwave can be supplied to the flat antenna 66 at higher power than the conventional antenna member. Thus, plasma processing time is reduced and throughput can be increased.

The inventor applied the flat antenna 66 according to this embodiment to an actual plasma processing apparatus, and found that input power can be increased up to 5,000 W without an abnormal discharge, while the plasma processing apparatus provided with the conventional antenna member permits the input power only up to 4,500 W due to an abnormal discharge occurring in or near the slot openings.

Additionally, since the length L3 of the contour of each of the openings 84 is rendered to be 0.5 times to 2.5 times the wavelength of the microwave supplied to the flat antenna 66, the microwave can be efficiently projected from the flat antenna 66, which results in an improvement of power efficiency.

FIG. 8 is a graph showing a relationship between an intensity of radiation field and a ratio of the length of the contour of the opening 84 to the wavelength of the microwave supplied to the flat antenna 66. As shown in FIG. 8, the intensity of radiation field is the maximum when the ratio is equal to 1.45, that is, when the length of the contour of each of the openings 84 is 1.45 times the wavelength of the microwave supplied to the flat antenna 66. Additionally, it can be observed that, in order to obtain more than 70% of the maximum intensity of radiation field, the length of the contour of each of the openings 84 should be 0.5 times to 2.5 times the wavelength of the microwave supplied to the flat antenna 66.

In the present embodiment, the contour of each of the openings 84 is an elongated elliptic shape, that is, the shape of each of the openings 84 in a plan view is an elongated ellipse. However, the contour of each of the openings 84 is not limited to the elongated ellipse, and various shapes may be used for the contour as long as the shape does not have a sharp corner.

FIGS. 9A through 9F are illustrations of various shapes that can be used for the contour of each of the openings provided in the flat antenna according to the present embodiment. FIG. 9A shows a complete circular shape; FIG. 9B shows an elliptic shape; FIG. 9C shows an elongated oblong shape; FIG. 9D shows a triangular shape with rounded corners 84B; FIG. 9E shows a square shape with rounded corners 84B; FIG. 9F shows a rectangular shape with rounded corners 84B. Other polygonal shapes having rounded corners may also be used.

Since each of the openings 84 shown in FIGS. 9A through 9F does not have a sharp corner in its plan view, the possibility of occurrence of an abnormal discharge is reduced. Thus, a high input power can be supplied to the flat antenna 66. It should be noted that the length of the contour of the openings 84 shown in each of FIGS. 9A through 9F is preferably set to 0.5 times to 2.5 times the wavelength of the microwave supplied to the flat antenna 66, similar to the case in which each of the openings 84 has an elongated elliptic shape.

In the above-mentioned structure, the inner surface of each of the openings 84 is perpendicular to the surface of the flat antenna 66. In this case, a relatively sharp edge (90 degrees) is formed between the inner surface of each of the openings 84 and the surfaces of the flat antenna 66. Accordingly, a concentration of electric field may occur at the edge between the inner surface of each of the openings 84 and a surface of the flat antenna 66. In order to avoid such a concentration of an electric field, it is preferable that the inner surface of each of the openings 84 be rounded as shown in FIG. 10. In FIG. 10, the inner surface 84C is formed in a convex, semicircular shape having a diameter equal to the thickness of the flat antenna 66 in a cross-sectional view.

According to this structure, since the rounded inner surface 84C of each of the openings 84 does not form a sharp edge, an occurrence of concentration of an electric field at a portion between the inner surface of each of the openings and a surface of the flat antenna 66 can be prevented, which results in further reduction of the possibility of generation of an abnormal discharge. Accordingly, a higher input power can be supplied to the flat antenna 66, which results in a further improvement in the throughput.

Figure 11:
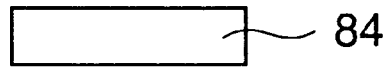
FIG. 11 is an illustration of an opening having an elongated rectangular shape.

The above-mentioned configuration of the inner surface 84C of each of the openings 84 can be applied to the opening 84 having an elongated rectangular shape as shown in FIG. 11. In such a case, although the sharp corners would still appear in the plan view, the sharp edges would be eliminated and not appear in the cross-sectional view, which provides the above-mentioned advantage of the rounded inner surface.

A description will now be given, with reference to FIGS. 12 through 15, of various arrangements of the openings 84.

Figure 12:
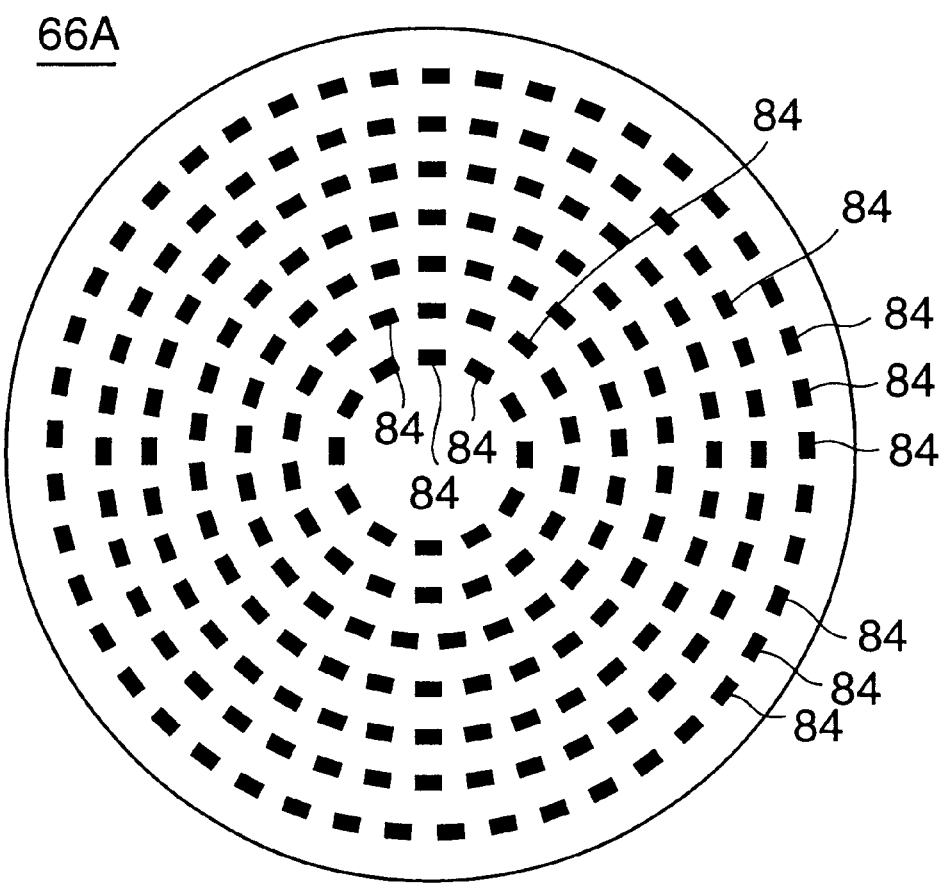
FIG. 12 is a plan view of a flat antenna in which the openings are arranged along concentric circles with a uniform pitch in both a radial direction and a circumferential direction.

FIG. 12 is a plan view of a flat antenna 66A in which the openings 84 are arranged along concentric circles with a uniform pitch in both a radial direction and a circumferential direction. Accordingly, the openings 84 are uniformly distributed over the entire flat antenna 66A.

Figure 13:
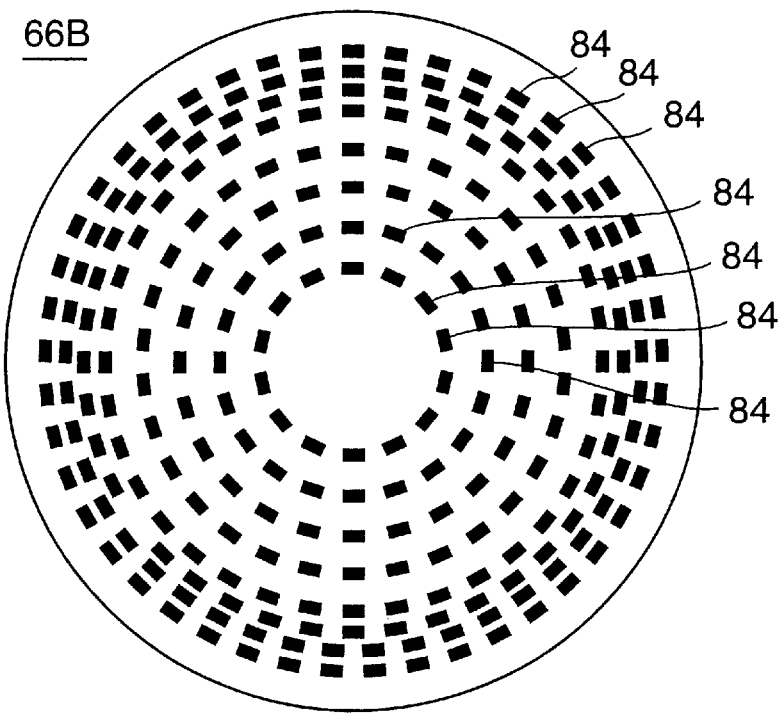
FIG. 13 is a plan view of a flat antenna in which the openings are arranged along concentric circles with different pitches both in a circumferential direction and a radial direction.

FIG. 13 is a plan view of a flat antenna 66B in which the openings 84 are arranged along concentric circles with different pitches in a circumferential direction and different pitches in a radial direction. That is, in the flat antenna 66B, both the pitch of the adjacent ones of the openings along the same circle and the distance between the adjacent ones of the concentric circles are changed at a middle position between the center and the periphery of the flat antenna 66B. That is, the pitch of the openings 84 along the same circle in the outer half portion of the flat antenna 66B is smaller than in the inner half portion of the flat antenna 66B, and the distance between the adjacent ones of the concentric circles in the outer half portion of the flat antenna 66B is smaller than that of the inner half portion of the flat antenna 66B so that the density of the openings 84 in the outer half portion is higher than in the inner half portion.

Figure 14:
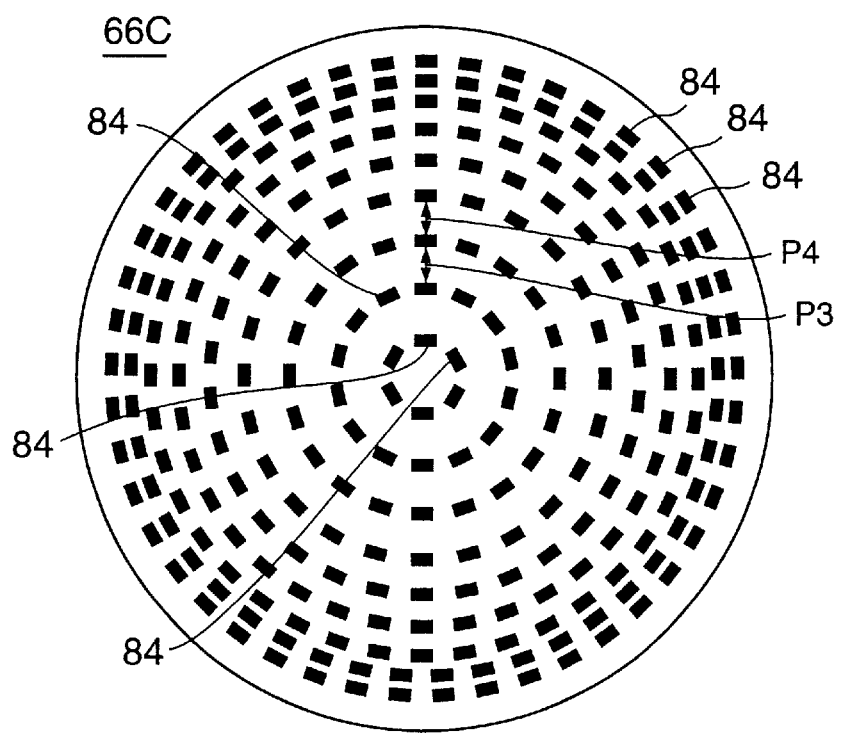
FIG. 14 is a plan view of a flat antenna in which the openings are arranged along concentric circles with the pitch being gradually decreased toward the periphery of the flat antenna.

FIG. 14 is a plan view of a flat antenna 66C in which the openings 84 are arranged along concentric circles with a pitch being gradually decreased toward the periphery of the flat antenna 66C. That is, in the flat antenna 66C, the density of the openings 84 is gradually increased from the center portion to the periphery of the flat antenna 66C. More specifically, in FIG. 14, the distance between the adjacent openings of adjacent concentric circles is reduced by a reduction ratio of 0.8 to 0.95, for each set of concentric circles moving from the center toward the periphery. That is, in FIG. 14, a pitch P4 and a pitch P3 satisfy a relationship P4=0.8×P3 to 0.95×P3, where P3 is a pitch (distance) between adjacent openings of the inner set of adjacent concentric circles and P4 is a pitch (distance) between the adjacent openings of the adjacent ones of the next outer set of concentric circles.

According to the arrangements of the openings 84 shown in FIGS. 13 and 14, the intensity of the electric field of the microwave can be increased near the periphery of the flat antenna 66B or 66C. Thereby, the plasma absorbed by the inner wall of the process chamber 22 can be compensated for so as to prevent the density of plasma from being decreased in the vicinity the periphery of the process chamber 22. Thus, plasma having a uniform density over the entire surface of the wafer W can be generated.

Figure 15:
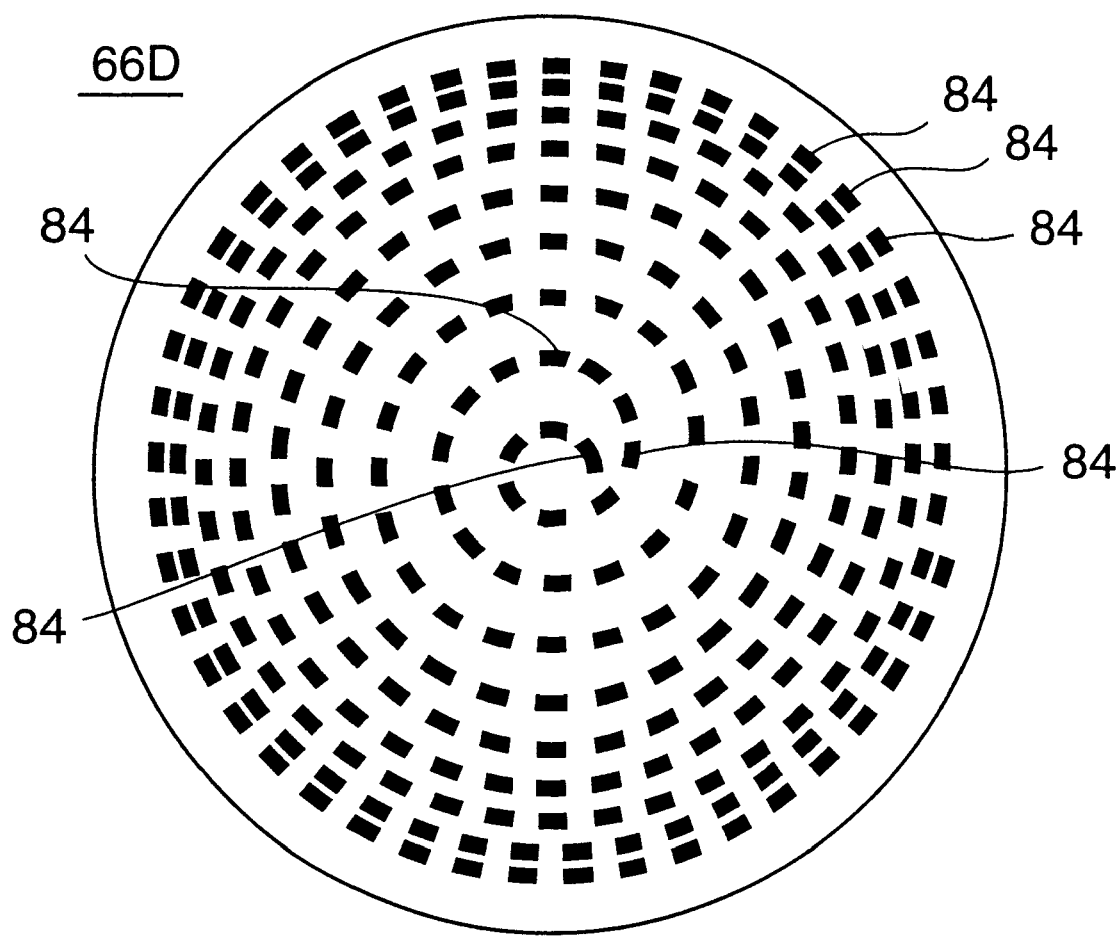
FIG. 15 is a plan view of a flat antenna in which the openings are arranged along a spiral beginning near the center of the flat antenna.

FIG. 15 is a plan view of a flat antenna 66D in which the openings 84 are arranged along a spiral beginning at the center of the flat antenna 66D. The pitch of the openings 84 may be uniform over the entire flat antenna 66D or may be gradually changed toward the periphery of the flat antenna 66D by a reduction ratio of 0.8 to 0.95 similar to that shown in FIG. 14. In this case, the same advantage as the above-mentioned flat antenna 66B or 66C can be obtained.

It should be noted that the openings 84 and the circular polarization conductive member 86 are illustrated in FIGS. 12 through 15 together as rectangles for the sake of simplification, and the reduction ratio of the pitch between the openings 84 in FIGS. 13 through 15 is increased in the illustration so as to emphasize the change in the density of the openings 84.

Figure 16:
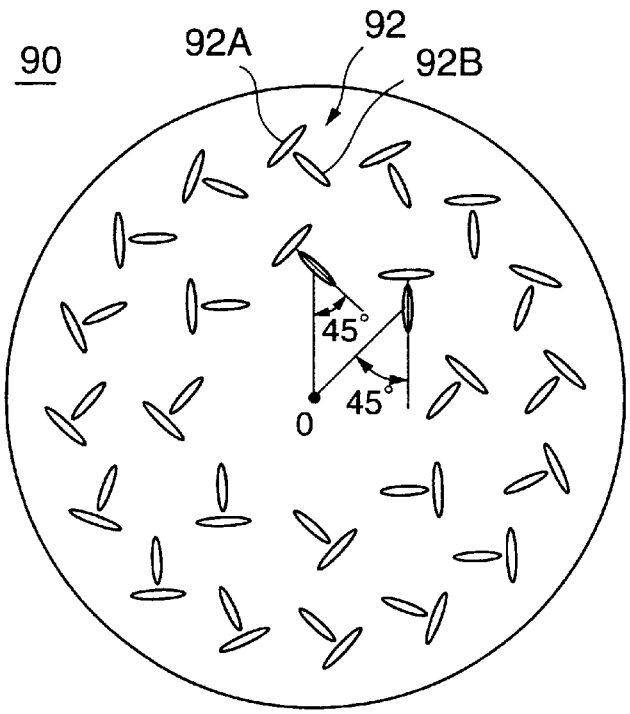
FIG. 16 is a plan view of a flat antenna according to a second embodiment of the present invention.

A description will now be given, with reference to FIGS. 16 and 17 of a second embodiment of the present invention. FIG. 16 is a plan view of a flat antenna 90 according to the second embodiment of the present invention.

The flat antenna 90 according to the second embodiment of the present invention is used for a plasma processing apparatus having the same structure as the plasma processing apparatus 20 shown in FIG. 5.

The flat antenna 90 has the same structure as the flat antenna 66 shown in FIG. 6 except for a plurality of pairs 92 of openings 92A and 92B being provided instead of the openings 84. The opening 92A has an elongated elliptic shape, and the opening 92B has the same shape as the opening 92A. The opening 92B is located close to the opening 92A so that each pair of openings 92A and 92B forms a T-like shape.

Figure 17:
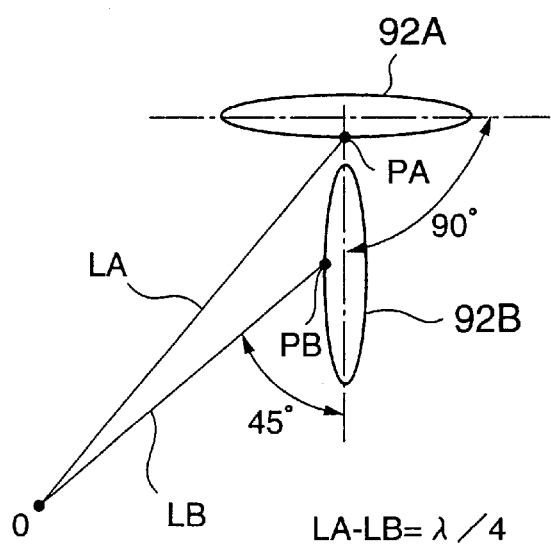
FIG. 17 is an enlarged view of a part of the flat antenna shown in FIG. 16, which part includes a pair of elliptic openings.

More specifically, as shown in FIG. 17, the opening 92B is positioned so that the longitudinal axis of the opening 92B inclines 45 degrees with respect to a line connecting the center O of the flat antenna 90 to a point PB along the contour of the opening 92B, the point PB being equidistant from the opposite ends of the opening 92B on the near side with respect to the center O of the flat antenna 90. The longitudinal axis of the opening 92B passes the contour of the opening 92A at a point PA equidistant from the opposite ends of the opening 92A on the near side with respect to the center O of the flat antenna 90. Additionally, the openings 92A and 92B in the same pair are positioned so that the difference between a distance LA and a distance LB is equal to one quarter of the wavelength $\lambda$ of the microwave transmitting within the flat antenna 90 (LA−LB=$\lambda$/4), where the distance LA is measured from the center of the flat antenna 90 to the point PA of the opening 92A and the distance LB is measured from the center O to the point PB of the opening 92B.

According to the above-mentioned arrangement of the pairs of elongated elliptic openings 92A and 92B, a circularly polarized microwave is generated and radiated toward the process chamber 22. That is, a current flowing from the center O of the flat antenna 92 first reaches the point PB of the opening 92B, and then reaches the point PA of the opening 92A after a period corresponding to one quarter of the wavelength of the microwave transmitting the flat antenna 90. Thus, the circularly polarized microwave is radiated downward toward the process chamber 22. Since the circularly polarized microwave does not generate a concentration of electric field near the edge of the wafer W placed inside the process chamber, a uniform plasma can be applied over the entire wafer W.

It should be noted that although the plasma processing apparatus having one of the flat antennas according to the above-mentioned embodiments performs the plasma CVD process as plasma processing, the plasma processing is not limited to the plasma CVD process. That is, for example, a plasma etching process or a plasma ashing or stripping process may be performed by the plasma processing apparatus having one of the flat antennas according to the present invention.

Additionally, the material to be processed by the plasma processing apparatus is not limited to the wafer for producing a semiconductor device, and the plasma processing apparatus may be used to process an LCD substrate or a glass substrate.

The present invention is not limited to the specifically disclosed embodiments, and variations and modifications may be made without departing from the scope of the present invention.

The present application is based on Japanese priority application No. 11-057746 filed on Mar. 4, 1999, the entire contents of which are hereby incorporated by reference.

What is claimed is:

1. A plasma processing apparatus for processing a material to be processed by plasma, the plasma processing apparatus comprising:

a process chamber provided with a table on which the material to be processed is placed;

a microwave generator generating a microwave;

a waveguide transmitting the microwave from the microwave generator; and a flat antenna, with the waveguide connected to its center so that the microwave introduced into the flat antenna from the waveguide propagates within the flat antenna in radial directions thereof, and positioned outside the process chamber so that the flat antenna is positioned above the table with a top plate of the process chamber therebetween and the flat antenna is positioned parallel to a top surface of the table, the flat antenna comprising:

a front surface to which the microwave is supplied and a back surface opposite to the front surface, the microwave being supplied to a center portion of the front surface and propagating in radial direction within the flat antenna; and a plurality of openings each of which extends between the front surface and the back surface of the flat antenna, a contour of each of the openings being curved and corners being rounded so as to prevent generation of an abnormal discharge.

2. The plasma processing apparatus as claimed in claim 1, wherein each of the openings has an elongated elliptic shape.

3. The plasma processing apparatus as claimed in claim 1, wherein each of the openings has a polygonal shape, and each corner of the polygonal shape is rounded so as to prevent a concentration of an electric field generated by the microwave.

4. The plasma processing apparatus as claimed in claim 1, wherein an edge between an inner wall of each of the openings and each of the front surface and the back surface of the flat antenna is rounded so as to prevent a concentration of an electric field generated by the microwave.

5. The plasma processing apparatus as claimed in claim 1, wherein the openings are arranged along a plurality of concentric circles.

6. The plasma processing apparatus as claimed in claim 5, wherein a density of the openings is increased toward a periphery of the flat antenna.

7. The plasma processing apparatus as claimed in claim 1, wherein the openings are arranged along a spiral.

8. The plasma processing apparatus as claimed in claim 7, wherein a density of the openings is increased toward a periphery of the flat antenna.

9. The plasma processing apparatus as claimed in claim 8, wherein a distance between adjacent openings along the spiral is sequentially reduced to a range between 0.8 and 0.95 of the previous distance.

10. The plasma processing apparatus as claimed in claim 1, wherein a length of a contour of each of the openings ranges from 0.5 times a wavelength of the microwave to 2.5 times the wavelength of the microwave.

11. The plasma processing apparatus of claim 1, wherein said waveguide is a coaxial waveguide.

12. The plasma processing apparatus of claim 1, wherein said waveguide is a circular waveguide.

13. The plasma processing apparatus of claim 1, wherein said waveguide is a square waveguide.

14. A plasma processing apparatus for processing a material to be processed by plasma, the plasma processing apparatus comprising:

a process chamber provided with a table on which the material to be processed is placed;

a microwave generator generating a microwave;

a waveguide transmitting the microwave from the microwave generator; and a flat antenna, with the waveguide connected to its center so that the microwave introduced into the flat antenna from the waveguide propagates within the flat antenna in radial directions thereof, and positioned outside the process chamber so that the flat antenna is positioned above the table with a top plate of the process chamber therebetween and the flat antenna is positioned parallel to a top surface of the table, the flat antenna comprising:

a front surface to which the microwave is supplied and a back surface opposite to the front surface, the microwave being supplied to a center portion of the front surface and propagating in radial direction within the flat antenna; and a plurality of openings each of which extends between the front surface and the back surface of the flat antenna, an edge between an inner wall of each of the openings and each of the front surface and the back surface of the flat antenna being rounded so as to prevent a concentration of an electric field generated by the microwave.

* * * * *